US006189591B1

(12) United States Patent
Ariye et al.

(10) Patent No.: US 6,189,591 B1
(45) Date of Patent: Feb. 20, 2001

(54) WAFER SHEET EXPANDING APPARATUS AND PELLET BONDING APPARATUS USING THEREOF

(75) Inventors: Makoto Ariye; Yasushi Takeda, both of Ebina (JP)

(73) Assignee: Shibaura Mechatronics Corporation, Yokohama (JP)

( * ) Notice: Under 35 U.S.C. 154(b), the term of this patent shall be extended for 0 days.

(21) Appl. No.: 09/235,285

(22) Filed: Jan. 22, 1999

(51) Int. Cl.[7] .................................................. B32B 35/00
(52) U.S. Cl. ........................ 156/584; 438/464; 414/935
(58) Field of Search ................................. 156/344, 584; 414/935, 941; 438/464, 976

(56) References Cited

U.S. PATENT DOCUMENTS

| 3,448,510 | * | 6/1969 | Bippus et al. | 29/413 |
| 3,537,603 | * | 11/1970 | Willis et al. | 414/811 |
| 3,766,638 | * | 10/1973 | Moore | 438/464 |
| 5,238,876 | * | 8/1993 | Takeuchi et al. | 438/464 |
| 5,288,663 | * | 2/1994 | Ueki | 438/460 |
| 5,725,728 | * | 3/1998 | Fuke et al. | 156/584 |
| 5,824,185 | * | 10/1998 | Nakamura et al. | 156/584 |
| 5,853,532 | * | 12/1998 | Nakamura et al. | 156/584 |

FOREIGN PATENT DOCUMENTS 9-82783  3/1997 (JP) .

* cited by examiner

Primary Examiner—Mark A. Osele
(74) Attorney, Agent, or Firm—Finnegan, Henderson, Farabow, Garrett & Dunner, L.L.P.

(57) ABSTRACT

A wafer sheet expanding apparatus comprises an expanding mechanism, a rotating mechanism for the expanding mechanism, a motor, a power transfer mechanism. The expanding mechanism has a support ring, an expanding ring, and a movement mechanism. The support ring has a hole at a central part thereof and a circular annulus portion formed projectively on an outer-peripheral portion of the hole and an upper end for supporting a wafer sheet retained by a wafer ring. The expanding ring is disposed opposite the support ring and has an annular portion that is loosely fitted over the circular annulus portion. The movement mechanism causes relative movement of the support ring and the expanding ring. The expanding mechanism stretches the wafer sheet by relative movement of the support ring and the expanding ring. The power transfer mechanism connects the movement mechanism and the rotating mechanism to a motor selectively.

8 Claims, 4 Drawing Sheets

Fig.4

WAFER SHEET EXPANDING APPARATUS AND PELLET BONDING APPARATUS USING THEREOF

BACKGROUND OF THE INVENTION

1. Field of the Invention

The present invention relates to a wafer sheet expanding apparatus for expanding a wafer sheet retained by a wafer ring and a pellet bonding apparatus using thereof.

2. Description of the Background Art

As a machine sequentially picking up a semiconductor pellet from a wafer sheet having pasted thereon a wafer divided in units of a semiconductor pellet that retained by a wafer ring and bonding the picked up semiconductor pellet onto a substrate such as a lead frame or carrier tape, this is known a pellet bonding machine. The pellet bonding machine, in advance of the pickup operation of the semiconductor pellets, removes the slack of the wafer sheet or forms very small gaps between the semiconductor pellets for picking up the semiconductor pellet excellently from the wafer sheet. At this time, these small gaps are formed by stretching of the wafer sheet retained by the wafer ring by the use of a wafer sheet expanding apparatus. A conventional wafer sheet expanding apparatus is described in, for example, Japanese Patent Application Laid-Open No.9-82783.

This wafer sheet expanding apparatus comprises an expanding mechanism, a rotating mechanism, and an XY table. The expanding mechanism stretches a wafer sheet. The rotating mechanism rotates the expanding mechanism. The XY table moves the expanding mechanism in the X and Y directions. Each of the expanding mechanism, rotating mechanism and XY table has drive means such as a motor or air cylinder. And then, when the wafer ring is supplied to the wafer sheet expanding apparatus, first, the expanding mechanism stretches the wafer sheet. Next, the amount of positional displacement in the rotation direction of the wafer (pellet) on the stretched wafer sheet is detected using a camera. In a case where the positional displacement in the rotation direction of the wafer has been detected by the camera, the rotating mechanism makes its rotation in the direction of correcting this displacement. Also, in a case where dividing the wafer into a plurality of equal areas and picking up the semiconductor pellet for each area, the rotating mechanism rotates the expanding mechanism so that the area from which the pellet is to be picked up this time may be located at the pickup position where the pellet is to be picked up by a suction nozzle such as a pellet transfer member. Thereafter, each semiconductor pellet on the wafer sheet is positioned at the pickup position and is picked up by the suction nozzle and bonded to a lead frame or the like.

Meanwhile, in the above-described expanding apparatus, single purpose drive means is used for each of the expanding mechanism and rotating mechanism. This raises the problem that the expanding apparatus becomes large in size and in weight because of the necessity of ensuring the space for disposing the respective drive means with respect to the apparatus. In addition, the drive means for the expanding mechanism and that for the rotating mechanism are very low in the operation rate compared to the drive means for the XY table. Namely, during the pickup operation (pellet bonding operation) of the semiconductor pellet, the drive means for the XY table operates for each pickup of the semiconductor pellet in order to position the semiconductor pellet sequentially at the pickup position. On the other hand, the drive means for the expanding mechanism operates only at the time of expanding the wafer sheet and at the time of releasing the stretched state of the wafer sheet. Also, the drive means for the rotating mechanism operates only at the time of correcting the rotational displacement of the wafer or at the time of changing the pickup area of the semiconductor pellet. Providing the drive means whose operation rate is low individually is not preferable in terms of construction of the apparatus.

SUMMARY OF THE INVENTION

An object of the invention is to provide a wafer sheet expanding apparatus which is small in size, light in weight and makes it possible to increase the operation rate of the drive motor.

The present invention is comprising an expanding mechanism that includes a support ring having a hold at a central part thereof and including a circular annulus portion formed projectively on an outer-peripheral potion of the hole and having an upper end for supporting a wafer sheet retained by a wafer ring, an expanding ring disposed opposed the support ring and having an annular portion that is loosely fitted over the circular annulus portion, and a movement mechanism for causing relative movement of the support ring and expanding ring in the direction of towards each other to stretch the wafer sheet, and a mechanism for rotating the expanding mechanism, and a power transfer mechanism connecting the movement mechanism and the rotating mechanism to a single drive motor.

According to the present invention, when stretching the wafer sheet retained by the wafer ring, the single drive motor is connected to the movement mechanism by the power transfer mechanism to thereby contact the support ring and the expanding ring with each other. When adjusting the rotation position of the wafer on the wafer sheet stretched by the expanding mechanism, the single drive motor is connected to the rotating mechanism by the power transfer mechanism to thereby rotate the expanding mechanism. As a result of this, the single drive motor is used concurrently both as drive motor for driving the expanding mechanism and as drive motor for driving the rotating mechanism.

BRIEF DESCRIPTION OF THE DRAWINGS

The present invention will be more fully understood from the detailed description given below and from the accompanying drawings which should not be taken to be a limitation on the invention, but for explanation and understanding only.

The drawings

FIG. 4 is a front sectional view illustrating another embodiment of the present invention.

DESCRIPTION OF THE PREFERRED EMBODIMENTS

Figure 1:
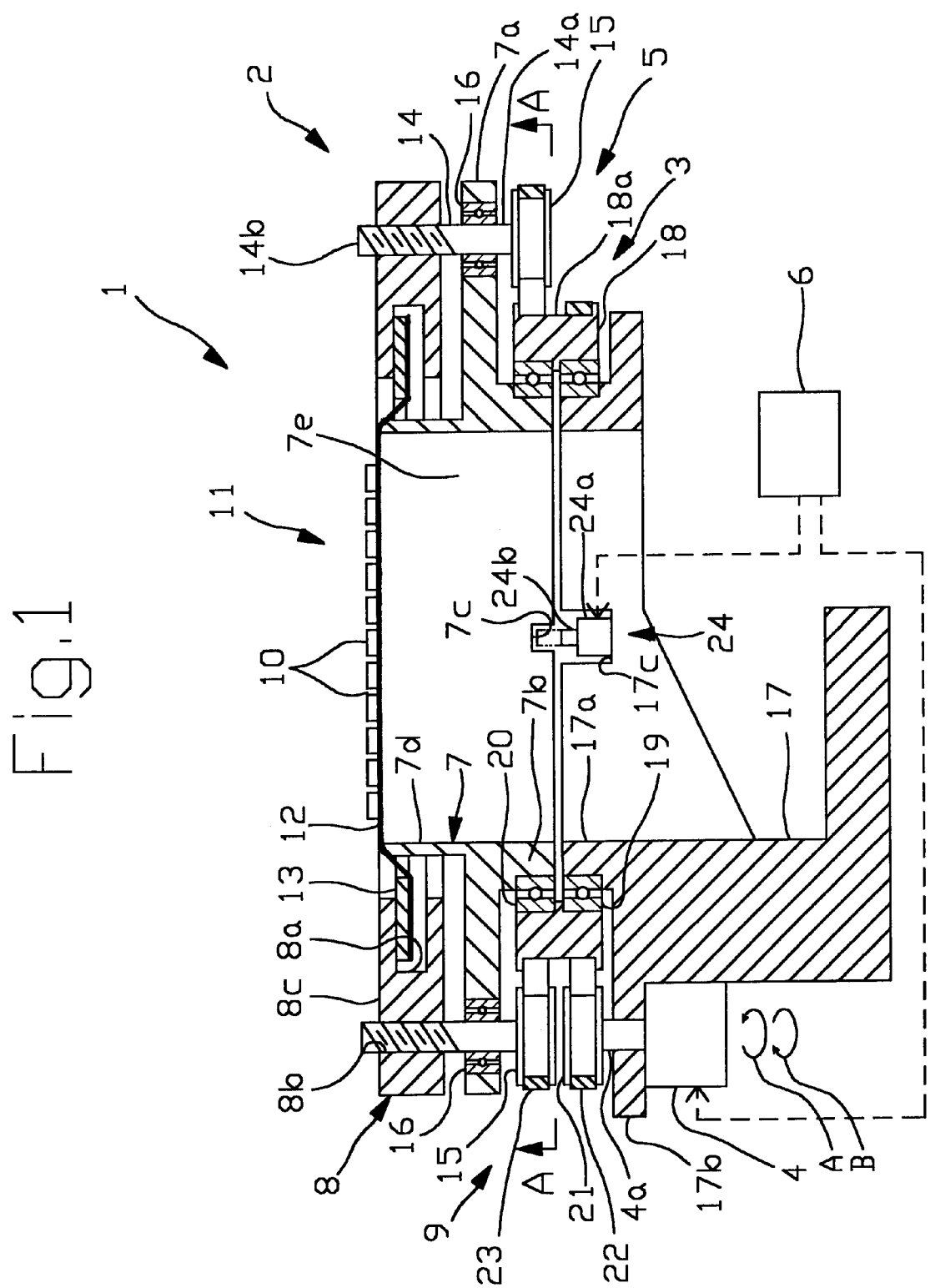
FIG. 1 is a front sectional view illustrating the construction of a wafer sheet expanding apparatus according to the present invention.
Figure 2:
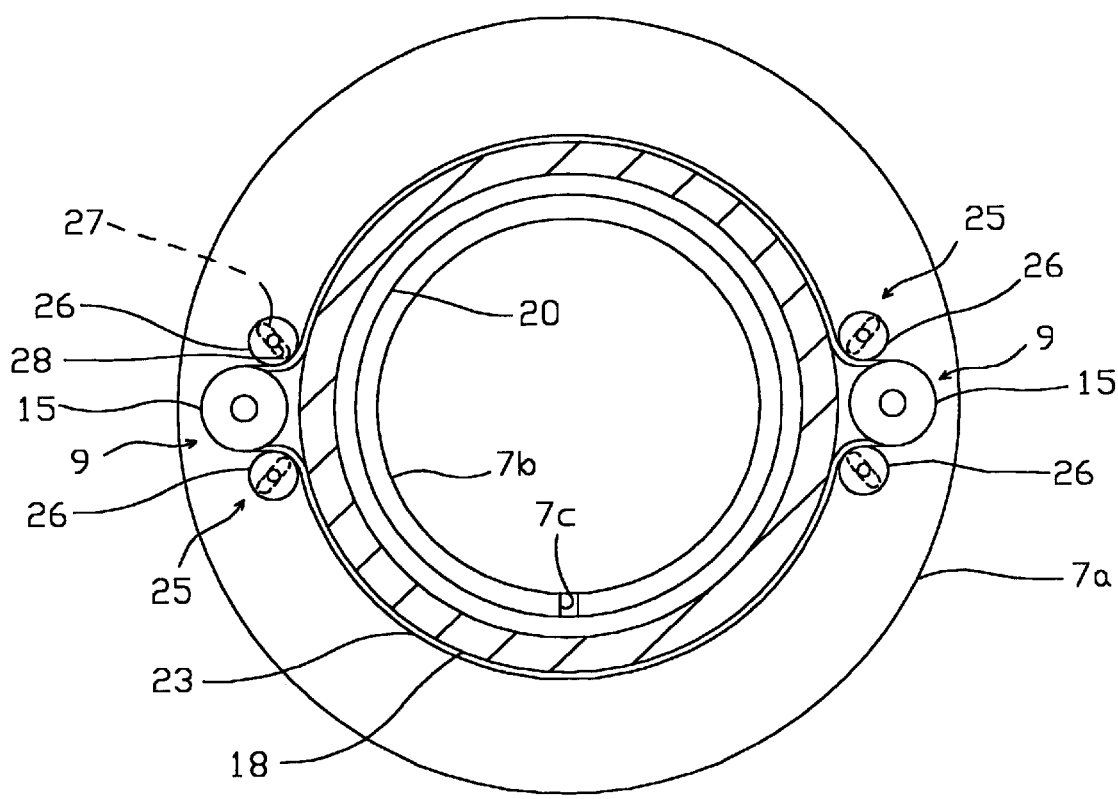
FIG. 2 is a sectional view taken along a line A—A of FIG. 1.

A first embodiment of the present invention will now be explained with reference to the drawings. FIG. 1 is a front sectional view illustrating the construction of a wafer sheet expanding apparatus according to the present invention; FIG. 2 is a sectional view taken along a line A—A of FIG.

Figure 3:
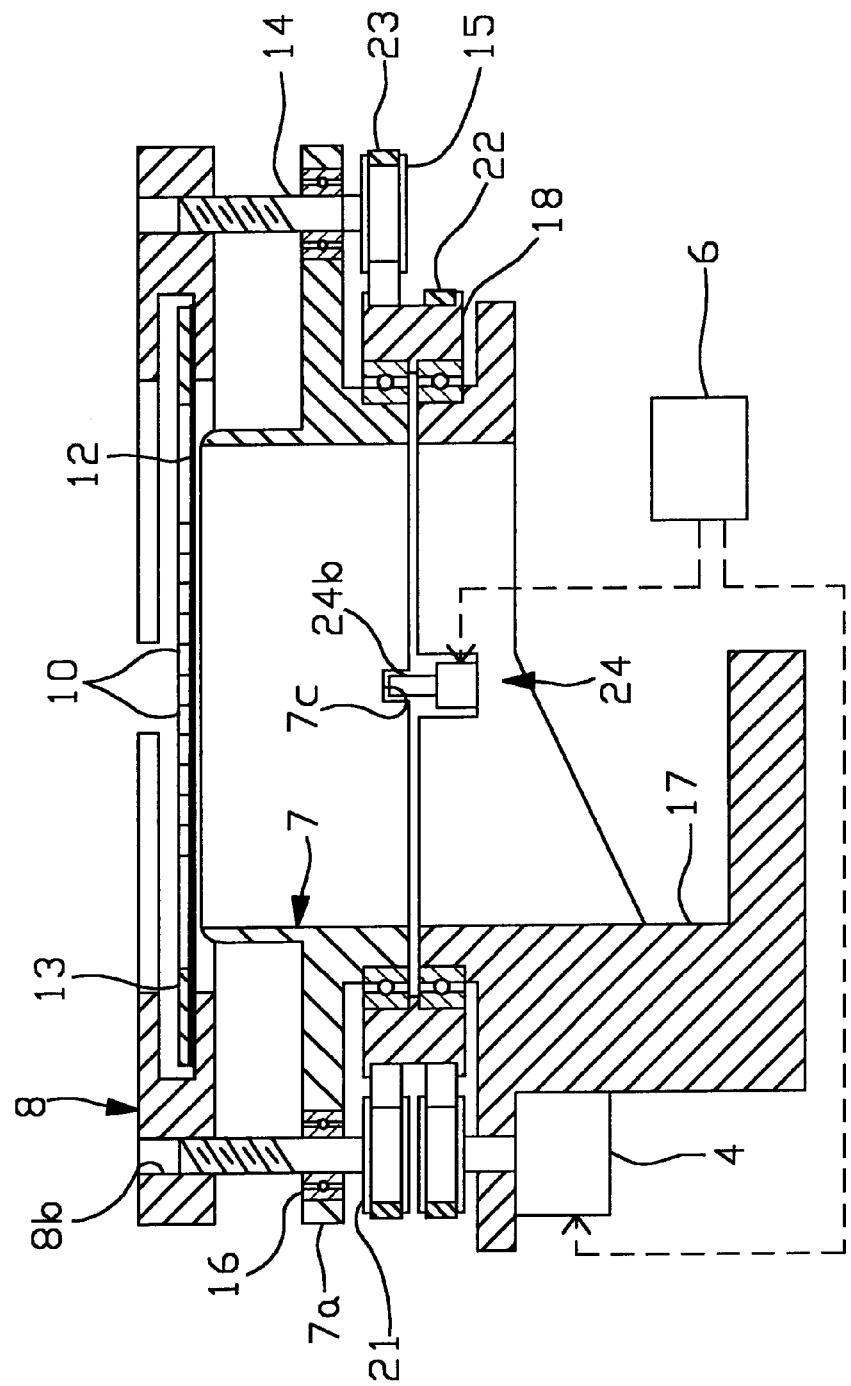
FIG. 3 is a front sectional view illustrating an operational state of FIG. 1.

1; and FIG. 3 is a front sectional view illustrating an operational state of FIG. 1.

A wafer sheet expanding apparatus 1 comprises an expanding mechanism 2, a rotating mechanism 3, a single drive motor 4, a power transfer mechanism 5 and a central processing unit (CPU) 6 serving as controller.

The expanding mechanism 2 has a support ring 7, an expanding ring 8, and a screw mechanism 9 serving as a movement mechanism. The support ring 7 has a hole 7e at a central part thereof. A circular annulus portion 7d is formed projectively on an outer-peripheral portion of the hole 7e. And, the circular annulus portion 7d has an upper end portion which supports a wafer sheet 12 retained by a wafer ring 13 and pasted thereon a wafer 11 divided for each semiconductor pellet 10. The expanding ring 8 is disposed opposite and above the support ring 7. The expanding ring 8 has an annular portion 8c, which is loosely fitted over the circular annulus portion 7d, and has an engaging recessed portion 8a, engaging the wafer ring 13. The annular portion 8c stretches the wafer sheet 12 in cooperation with the circular annulus portion 7d. The screw mechanism 9 is disposed at the position that are symmetrical about the center of the support ring 7 (see FIG. 2). Namely, the screw mechanism 9 is disposed around the circular annulus portion 7d of the support ring 7 at equal intervals. And the screw mechanism 9 is cause upward/downward movement of the expanding ring 8 relative to the support ring 7. The screw mechanism 9 has a plurality of screw shaft 14 and pulley 15 fixed to lower end portion 14a (input shaft) of the screw shaft 14. The screw shaft 14 is supported rotationally by a bearing 16 formed in a flange portion 7a of the support ring 7. Also, a male screw portion 14b is formed on the end of the screw shaft 14 on a side opposite to the pulley 15. The male screw portion 14b is screwed with respect to a female screw portion 8b formed in the expanding ring 8.

The rotating mechanism 3 has a support base 17 that is placed on an XY table (not illustrated) and an annular pulley 18 serving as a rotating ring. A lower half portion of the annular pulley 18 is connected rotationally through a bearing 19 to a boss portion 17a formed on an upper portion of the support base 17. An upper half portion of the annular pulley 18 is connected rotationally through a bearing 20 to a boss portion 7b formed on a lower portion of the support ring 7. Also, in an outer-peripheral portion of the annular pulley 18 there is formed a groove portion 18a for having wound thereover a first drive belt 22 and a second drive belt 23 as later described.

The motor (single drive motor) 4 is fixed to the underside of a flange portion 17b of the support base 17. And an output shaft 4a of the motor 4 is protruded upwardly from the flange portion 17b. A forward end of the output shaft 4a is fixed to a pulley 21.

The power transfer mechanism 5 has the first drive belt 22, the second drive belt 23 and an electromagnetic solenoid 24 serving as stopper. The first drive belt 22 is wound over the pulley 21 and the annular pulley 18. The second drive belt 23 is wound over the respective pulleys 15 of the screw mechanism 9 and the annular pulley 18. Also, the first drive belt 22 and the second drive belt 23 have tension imparted thereto by tension imparting mechanism 25 (FIG. 2). It is to be noted that since the tension imparting mechanism 25 provided on the respective drive belt 22 and 23 are of the same structure, an explanation is given of only the tension imparting mechanism 25 provided on the second drive belt 23 and an explanation of the tension imparting mechanism 25 of the first drive belt 22 is omitted. As illustrated in FIG. 2, the tension imparting mechanisms 25 are disposed in correspondence with the respective pulleys 15 and each has a pair of rotating rollers 26 and support shafts 28. The support shafts 28 support the rotating roller 26 to be freely rotational and free adjustable in the longitudinal directions of long slots 27 provided in the flange portion 7a. Namely, the tension imparting mechanism 25 makes it possible to adjust the tension that is imparted to the second drive belt 23. These adjusting is operated by loosening the nuts of fixing means composed of bolts and nuts (not illustrated) that are mounted on the support shafts 28 and moving these support shafts 28 in the longitudinal directions of the long slots 27. The electromagnetic solenoid 24 has a base portion 24a and a rod 24b that protrudes from and retracts into this base portion 24a. The base portion 24a is fixed to a notched portion 17c of the support base 17. Also, as indicated by a two-dot chain line in FIG. 1, the rod 24b of the electromagnetic solenoid 24 is engaged with a recessed portion 7c of the support ring 7 in its protruded state. Now, the support ring 7 is situated at the initial set position in the rotation direction of the support ring 7. It is to be noted that in this embodiment the power transfer mechanism 5 in the construction thereof commonly uses the annular pulley 18 of the rotating mechanism 3.

The CPU 6 is electrically connected to the motor 4 and the electromagnetic solenoid 24 for control thereof.

Next, the operation of the wafer sheet expanding apparatus is explained.

As illustrated in FIG. 3, in advance of the supply of the wafer ring 13, the support ring 7 is positioned at the initial set position thereof. Now, the protruded rod 24b of the electromagnetic solenoid 24 is engaged in the recessed portion 7c of the support ring 7. Also, the expanding ring 8 is positioned at the release position where the wafer ring 13 is released.

When the wafer ring 13 is supplied to the interior of the engaging recess portion 8a of the expanding ring 8, the expanding operation of the wafer sheet 12 is started.

In the expanding operation, first, the motor 4 is rotated in an arrow A direction. At this time, due to the engagement of the rod 24b with the recessed portion 7c, the rotation of the support ring 7 relative to the support base 17 is checked. Consequently, the annular pulley 18 rotated by the motor 4 through the first drive belt 22 is rotated around the boss portion 7b of the support ring 7 and the boss portion 17a of the support base 17. And the annular pulley 18 rotates the pulley 15, i.e., the screw shaft 14 through the second drive belt 23. The expanding ring 8 is lowered through the rotation of the screw shaft 14. In the process in which the expanding ring 8 is lowered, the wafer sheet 12 is supported by an upper end portion of the circular annulus portion 7d and, due to a further downward movement of the expanding ring 8, as illustrated in Fig, 1, the wafer sheet 12 is stretched. Next, the amount of positional displacement in the rotational direction of the wafer 11 against the standard position is detected by an image processor (not illustrated) that uses a camera. The CPU 6 corrects the positional displacement in the rotational direction of the wafer 11 through the following operation according to the detection value that has been obtained by the image processor.

When performing the correction operation for correcting the positional displacement in the rotation direction of the wafer 11, as indicated by a solid line in FIG. 1, first, the rod 24b is lowered, whereby the rotation of the support ring 7 relative to the support base 17 is permitted. Next, the motor 4 is driven with a prescribed rotations number in a prescribed direction according to the detection value that has been obtained by the image processor, whereby the positional displacement in the rotation direction of the wafer 11 is corrected. Namely, upon rotation of the motor 4, this rotation is transmitted through the first drive belt 22 to the annular pulley 18. At this time, the relative rotation between the support ring 7 and the support base 17 is permitted as mentioned above. As a result, the support ring 7 is rotated jointly with the annular pulley 18 and the wafer 11 is rotated by the extent which corresponds to the positional displacement thereof. It is noted that the retention effect is acted on between the support ring 7 and the annular pulley 18 by the tension imparted to the second drive belt 23 wound over the pulley 15 and the annular pulley 18. As a result, no relative rotation occurs between the support ring 7 and the annular pulley 18.

After the completion of the correction of the positional displacement in the rotation direction of the wafer 11, the semiconductor pellets 10 on the wafer sheet 12 is positioned to the pickup position that to be picked up by an suction nozzle such as a pellet transfer. And then, the semiconductor pellet 10 positioned to the pickup position is picked up by the suction nozzle in order. It is to be noted that in a case where the wafer 11 is divided into two or four equal areas and the semiconductor pellet 10 is picked up for each divided area, the wafer 11 is rotated so that the area which is to be picked up this time may be moved to the pickup position simultaneously with the correction operation of the positional displacement in the above-described rotation direction.

After the completion of the pickup operation for picking up the semiconductor pellet 10 by the suction nozzle, the motor 4 is rotated in a prescribed direction, thereby positioning the support ring 7 to the initial set position. Thereafter, the electromagnetic solenoid 24 is driven, whereby the rod 24b is engaged with the recessed portion 7c. Next, the motor 4 is rotated in a direction (the arrow B direction) reverse to that at the time when performing the wafer sheet 12 expanding operation, whereby the expanding ring 8 is positioned at the release position. As a result the wafer sheet 12 is released. Then, the wafer ring 13 is conveyed out from over the wafer sheet expanding apparatus 1 by a conveying mechanism (not illustrated) and a new wafer ring 13 is supplied instead. Thereafter, similar operations are repeated. And when a final wafer ring 13 has been discharged out, the expanding apparatus 1 is stopped.

According to the above-described embodiment, the single drive motor 4 is used concurrently both as the drive motor for the expanding mechanism 2 and the drive motor for the rotating mechanism 3. This makes it possible to decrease the disposition space necessary for the disposition of the drive motor for the both mechanisms 2 and 3 to about a half of the conventional one. And this makes it possible to make the expanding apparatus 1 small size and light in weight.

Also, the single drive motor 4 is used concurrently both as the drive motor for the expanding mechanism 2 and the drive motor for the rotating mechanism 3. This makes it possible to greatly increase the operation rate of the motor 4 compared to a case where the drive motor have been provided individually with respect to the mechanisms 2 and 3.

Also, through the concurrent use of the single drive motor 4 both as the drive motor for expanding mechanism 2 and the drive motor for the rotating mechanism 3, this makes it possible to decrease the load applied onto the XY table for moving the support base 17 thereon in the XY directions, and therefore to make the inertial mass of the XY table small. As a result, it is possible to increase the stop precision and movement speed of the XY table. As a result, it is possible to increase the productivity of the pellet bonding machine to which this expanding apparatus 1 is applied and the reliability of the products produced by this bonding machine. Also, a small drive output for driving the XY table is only needed, the drive source for driving the XY table can be made small in size and hence the XY table itself can be made small in size. Therefore, the expanding apparatus 1 as a whole can be small in size and light in weight.

Incidentally, although in the above-described embodiment an example wherein the power transfer mechanism 5 is constructed using the belts 22 and 23, the pulley 18 and the electromagnetic solenoid 24 has been explained, the invention is not limited thereto. Namely, it will be sufficient if the power transfer mechanism 5 is of a structure wherein the drive force is able to selectively transfer from the drive motor to one of the expanding mechanism 2 and rotating mechanism 3 according to the necessity. For example, as illustrated in FIG. 4, a gear mechanism 30 may be used.

Figure 4:
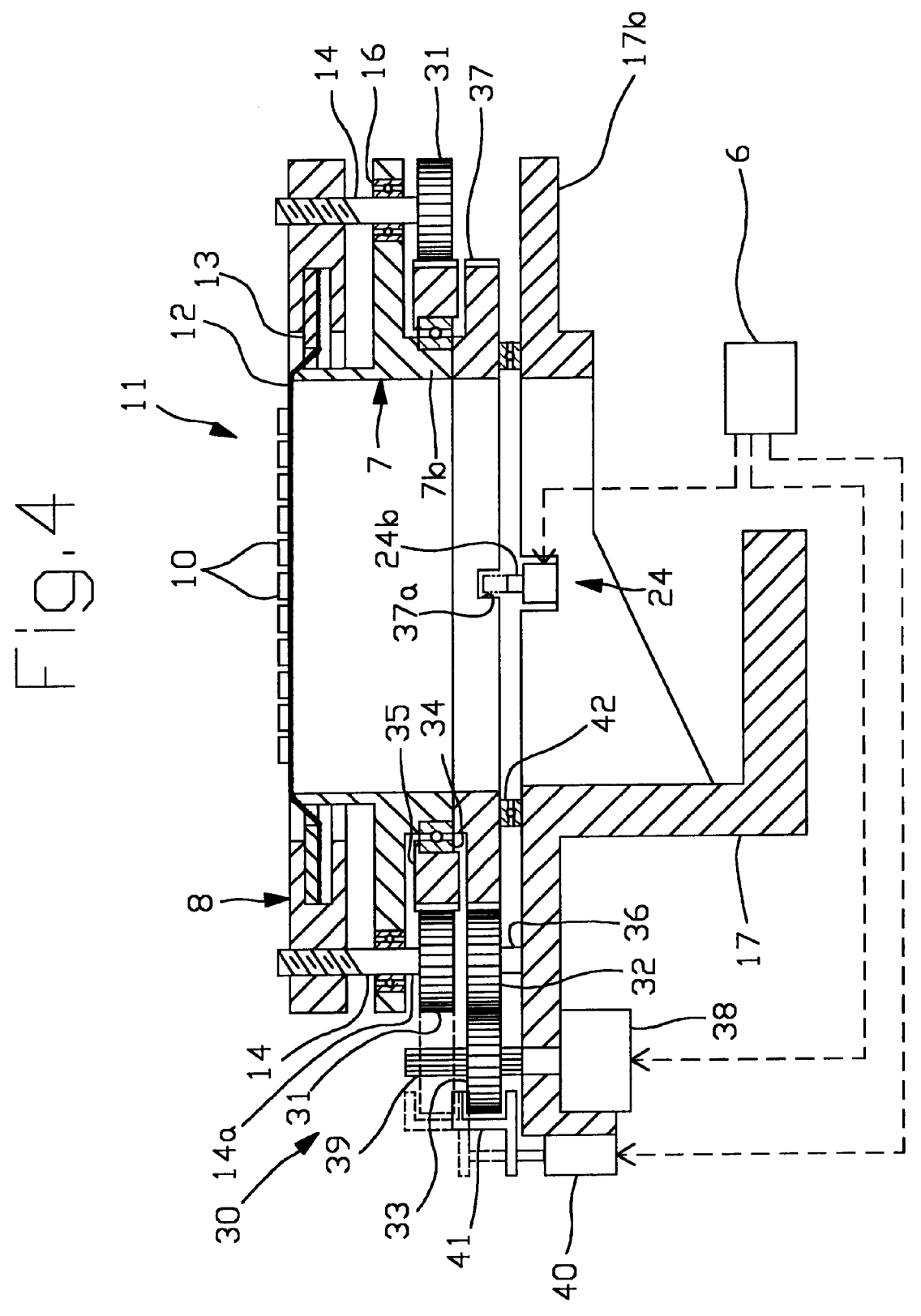

In FIG. 4, the gear mechanism 30 has driven gears 31 and 32 and a drive gear 33. The driven gear 31 is fixed to the lower end portion 14a (input shaft) of the screw shaft 14. And the driven gear 31 is meshed with an annular gear 35 that has been mounted on the outer-periphery of the boss portion 7b of the support ring 7 through a bearing 34. The driven gear 32 is supported rotationally by a support shaft 36 provided on the flange portion 17b of the support base 17. And the driven gear 32 is meshed with an annular gear 37 fixed to the underside of the boss portion 7b of the support ring 7. Now, both gears 31 and 32 are disposed on the same axis and are formed in such a way that the teeth numbers thereof are the same. And both gears 35 and 37 are disposed on the same axis and are formed in such a way that the teeth numbers thereof are the same. The drive gear 33 is provided on a spline shaft 39 connected to the output shaft of a motor 38. And the drive gear 33 may be slidable in the axial direction thereof. On the other hand, the drive gear 33 is engaged with an engaging pawl 41 of an electromagnetic solenoid 40. This electromagnetic solenoid 40 is connected to the CPU 6. And the engaging pawl 41 is switched to an upper position indicated by a two-dot chain line in FIG. 4 or a lower position indicated by a solid line in FIG. 4 by the electromagnetic solenoid 40. As a result, the position in the heightwise direction of the drive gear 33 is switched to the position of its being meshed with the driven gear 31 or the position of its being meshed with the driven gear 32. Also, the support ring 7 is supported on the support base 17 through a bearing 42. And, when performing the operation of expanding or releasing the wafer sheet 12, first, the engaging pawl 41 is switched to the upper position by the electromagnetic solenoid 40 to thereby mesh the drive gear 33 with the driven gear 31. Next, the motor 38 is forwardly or reversely driven to thereby rotate the respective screw shafts 14 through the drive gears 33, the driven gears 31 and the annular gear 35. Thereby, the expanding ring 8 is moved vertically. It is to be noted that at this operation time the rod 24b of the electromagnetic solenoid 24 is engaged beforehand with a recessed portion 37a of a annular gear 37 as in the case of the first embodiment. Also, when performing the correction operation in the rotation direction of the wafer 11, the rod 24b of the electromagnetic solenoid 24 is lowered. On the other hand, the engaging pawl 41 is switched to the lower position to thereby mesh the drive gear 33 with the driven gear 32. Next, the motor 38 is rotated in a prescribed direction to thereby rotate the annular gear 37 through the drive gear 33 and the driven gear 32. As a result of this, the support ring 7 is rotated in a prescribed direction. By constructing in this way, there is obtained the same effect as attainable with the above-described embodiment.

Besides, the power transfer mechanism 5 has been explained by way of an example of its being controlled through the operation of the CPU 6 in the above-described embodiments. But, the power transfer mechanism 5 may be of a type that manually performed by an operator according to the necessity.

Moreover, in the present invention, the expanding of the wafer sheet 12 means not only expanding it to such an extent that gaps are formed between the semiconductor pellets 10 pasted onto the wafer sheet 12 but also expanding it to such an extent as to zero the slack of the wafer sheet 12 retained by the wafer ring 13.

As described above, according to the present invention, it is possible to achieve the size and weight reduction and in addition to achieve the increase in the operation rate of the drive motor.

What is claimed is:

1. A wafer sheet expanding apparatus comprising:
    an expanding mechanism including a support ring having a hole at a central part thereof and including a circular annulus portion formed projectively on an outer-peripheral portion of the hole and having an upper end for supporting a wafer sheet retained by a wafer ring, an expanding ring disposed opposite the support ring and having an annular portion that is loosely fitted over the circular annulus portion, and a movement mechanism for causing relative movement of the support ring and the expanding ring in a direction of toward each other to stretch the wafer sheet;
    a mechanism for rotating the expanding mechanism; and
    a power transfer mechanism connecting the movement mechanism and the rotating mechanism to a single drive motor.

2. A wafer sheet expanding apparatus according to claim 1, further comprising a controller for controlling the power transfer mechanism to selectively supply the drive force from the single drive motor to the expanding mechanism or the rotating mechanism.

3. A wafer sheet expanding apparatus comprising:
    an expanding mechanism including a support ring having a hole at a central part thereof and including a circular annulus portion formed projectively on an outer-peripheral portion of the hole and having an upper end for supporting a wafer sheet retained by a wafer ring, an expanding ring disposed opposite the support ring and having an annular portion that is loosely fitted over the circular annulus portion, and a screw mechanism for causing relative movement of the support ring and the expanding ring in a direction of toward each other to stretch the wafer sheet;
    a rotating mechanism having a support base, and a rotating ring supported rotationally on the support base and supporting rotationally the support ring; and
    a power transfer mechanism including a first drive belt that connects a single drive motor and the rotating ring, a second drive belt that connects the rotating ring and an input shaft of the screw mechanism, and a stopper that stops selectively the relative rotation between the support base and the support ring, and a controller that switches the stopper to a state of stopping the relative rotation between the support base and the support ring or a state of permitting such relative rotation.

4. A wafer sheet expanding apparatus according to claim 3, wherein
    the expanding ring has a plurality of female screw portions that formed on the annular portion of the expanding ring at equal intervals,
    the screw mechanism has a plurality of screw shafts that having a male screw portion and located rotationally around the circular annulus portion of the support ring as opposite to the female screw portions of the expanding ring,
    whereby the male screw portion of the screw shafts screwed into the female screw portions of the expanding ring.

5. A pellet bonding apparatus having a wafer sheet expanding apparatus as following structure comprising:
    an expanding mechanism including a support ring having a hole at a central part thereof and including a circular annulus portion formed projectively on an outer-peripheral portion of the hole and having an upper end for supporting a wafer sheet retained by a wafer ring, an expanding ring disposed opposite the support ring and having an annular portion that is loosely fitted over the circular annulus portion, and a movement mechanism for causing relative movement of the support ring and the expanding ring in a direction of toward each other to stretch the wafer sheet;
    a mechanism for rotating the expanding mechanism; and
    a power transfer mechanism connecting the movement mechanism and the rotating mechanism to a single drive motor.

6. A pellet bonding apparatus having a wafer sheet expanding apparatus according to claim 5, further comprising a controller for controlling the power transfer mechanism to selectively supply the drive force from the single drive motor to the expanding mechanism or the rotating mechanism.

7. A pellet bonding apparatus having a wafer sheet expanding apparatus as following structure comprising:
    an expanding mechanism including a support ring having a hole at a central part thereof and including a circular annulus portion formed projectively on an outer-peripheral portion of the hole and having an upper end for supporting a wafer sheet retained by a wafer ring, an expanding ring disposed opposite the support ring and having an annular portion that is loosely fitted over the circular annulus portion, and a screw mechanism for causing relative movement of the support ring and the expanding ring in a direction of towards each other to stretch the wafer sheet;
    a rotating mechanism having a support base, and a rotating ring supported rotationally on the support base and supporting rotationally the support ring; and
    a power transfer mechanism including a first drive belt that connects a single drive motor and the rotating ring, a second drive belt that connects the rotating ring and an input shaft of the screw mechanism, and a stopper that stops selectively the relative rotation between the support base and the support ring, and a controller that switches the stopper to a state of stopping the relative rotation between the support base and the support ring or a state of permitting such relative rotation.

8. A pellet bonding apparatus having a wafer sheet expanding apparatus according to claim 7, wherein
    the expanding ring has a plurality of female screw portions that formed on the annular portion of the expanding ring at equal intervals, the screw mechanism has a plurality of screw shafts that having a male screw portion and located rotationally around the circular annulus portion of the support ring as opposite to the female screw portions of the expanding ring, whereby the male screw portion of the screw shafts screwed into the female screw portions of the expanding ring.

* * * * *